United States Patent
Ma

(10) Patent No.: US 6,905,357 B2
(45) Date of Patent: Jun. 14, 2005

(54) ELECTRICAL CONNECTOR WITH SAFE LOAD LEVER

(75) Inventor: Hao-Yun Ma, Tu-chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 24 days.

(21) Appl. No.: 10/680,822

(22) Filed: Oct. 6, 2003

(65) Prior Publication Data

US 2004/0229492 A1 Nov. 18, 2004

(30) Foreign Application Priority Data

May 16, 2003 (TW) ...................................... 92209060 U

(51) Int. Cl.⁷ .............................................. H01R 13/62
(52) U.S. Cl. ........................ 439/331; 439/342; 439/259
(58) Field of Search ................. 439/331–333, 439/342–343, 345, 259, 261

(56) References Cited

U.S. PATENT DOCUMENTS 6,219,241 B1 * 4/2001 Jones ......................... 361/704
6,280,222 B1    8/2001 Walkup
6,485,320 B1   11/2002 Ma
6,485,321 B1 * 11/2002 Trout et al. ................. 439/342

* cited by examiner

Primary Examiner—Truc T. T. Nguyen
(74) Attorney, Agent, or Firm—Wei Te Chung

(57) ABSTRACT

A connector (1) includes a connector body (2) fixed on a PCB (6), a clip (3), and a load lever (4). The connector body defines passageways (230) receiving terminals therein. The load lever includes an operational arm (43), two pivot axles (41) having an offset pressing portion (42) therebetween, and an operational portion (44). The operational portion includes an extending portion (440) extending upwardly from the operational arm, a middle portion (442) extending from an end of the extending portion, a bending portion (446) extending from an end of the middle portion, and a handle (444) extending from an end of the bending portion and being parallel to the middle portion. When the connector is in a closed state, a distance between the handle and the PCB is greater than a distance between the operational arm and the PCB. This configuration helps prevent an operator's hand from being hurt.

6 Claims, 4 Drawing Sheets

ELECTRICAL CONNECTOR WITH SAFE LOAD LEVER

BACKGROUND OF THE INVENTION

1. Field of the Invention

The present invention relates to an electrical connector for electrically connecting an electronic package such as a land grid array (LGA) chip with a circuit board such as a printed circuit board (PCB), and particularly to an LGA electrical connector with a load lever and a connector body.

2. Description of Prior Art

Land grid array (LGA) electrical connectors are widely used in personal computer (PC) systems to electrically connect LGA chips with printed circuit boards (PCBs). A typical LGA electrical connector comprises an insulative housing, a multiplicity of terminals received in the housing in a rectangular array, a metal load plate pivotally mounted to the housing, and a load lever attached to the housing. This kind of LGA electrical connector is disclosed in U.S. Pat. Nos. 6,280,222 and 6,485,320.

FIG. 5 shows a conventional LGA connector 7. The connector 7 comprises an insulative housing 71 fixed on a PCB (not shown), an operational lever 73 engaged with the housing 71, and a metal clip 72 mounted to the housing 71. The housing 71 defines a plurality of passageways (not shown) receiving a plurality of terminals (not shown) therein, and comprises a curved projection 712 extending from a side portion (not labeled) thereof. The clip 72 comprises a hook portion 721 protruding from one end thereof. The lever 73 comprises a pair of axles 731 having a pressing portion 732 therebetween, and an operational arm 733 extending perpendicularly from an end of one of the axles 731. In use, the connector 7 is firstly oriented to be in an open state, with the clip 72 perpendicular to the housing 71 and the pressing portion 732 of the lever 73 at a highest position. An LGA chip 74 is then put into the housing 71. Then, the connector 7 is adjusted to be in a closed state, with the clip 72 abutting the LGA chip 74, the pressing portion 732 of the lever 73 pressing the hook portion 721 of the clip 72, and the projection 712 of the housing 71 hooking the operational arm 733 of the lever 73. Thus, the LGA chip 74 is stably received in the connector 7, and accordingly is connected with the PCB.

During adjustment of the connector 7 from the open state to the closed state, an operator (not shown) must manually operate the operational arm 733 of the lever 73. A distance between the housing 71 and the PCB is a constant. When the operational arm 733 has reached a horizontal position in the closed state, a distance between the operational arm 733 and the PCB is a constant. This latter constant is so small that the operator frequently bumps or interferes with the PCB and/or the connector 7. There are no means to provide more space between the operational arm 733 and the PCB. Thus during the operation of the operational arm 733, the operator's hand is prone to be abraded or hurt.

A new electrical connector that overcomes the above-mentioned problems is desired.

SUMMARY OF THE INVENTION

An object of the present invention is to provide an electrical connector having a load lever with a handle that helps prevent an operator's hand from being abraded or hurt.

In order to achieve the above object, an electrical connector in accordance with a preferred embodiment of the present invention comprises a connector body fixed on a circuit substrate, a metal clip pivotally mounted to the connector body, and a load lever attached to the connector body. The connector body defines a plurality of passageways receiving a plurality of terminals therein. The load lever comprises an operational arm, a pair of pivot axles having a pressing portion therebetween and extending from one end of the operational arm, and an operational portion. The operational portion comprises an extending portion extending upwardly from and angularly relative to the operational arm, a middle portion extending from a distal end of the extending portion, a generally U-shaped bending portion extending from a distal end of the middle portion, and a handle extending from a distal end of the bending portion and being parallel to the middle portion. When the connector is in a closed state, a distance between the handle and the circuit substrate is greater than a distance between the operational arm and the circuit substrate. This configuration helps prevent an operator's hand from being abraded or hurt.

Other objects, advantages and novel features of the present invention will become more apparent from the following detailed description when taken in conjunction with the accompanying drawings, in which:

DESCRIPTION OF THE PREFERRED EMBODIMENTS

Reference will now be made to the drawings to describe the present invention in detail.

Figure 1:
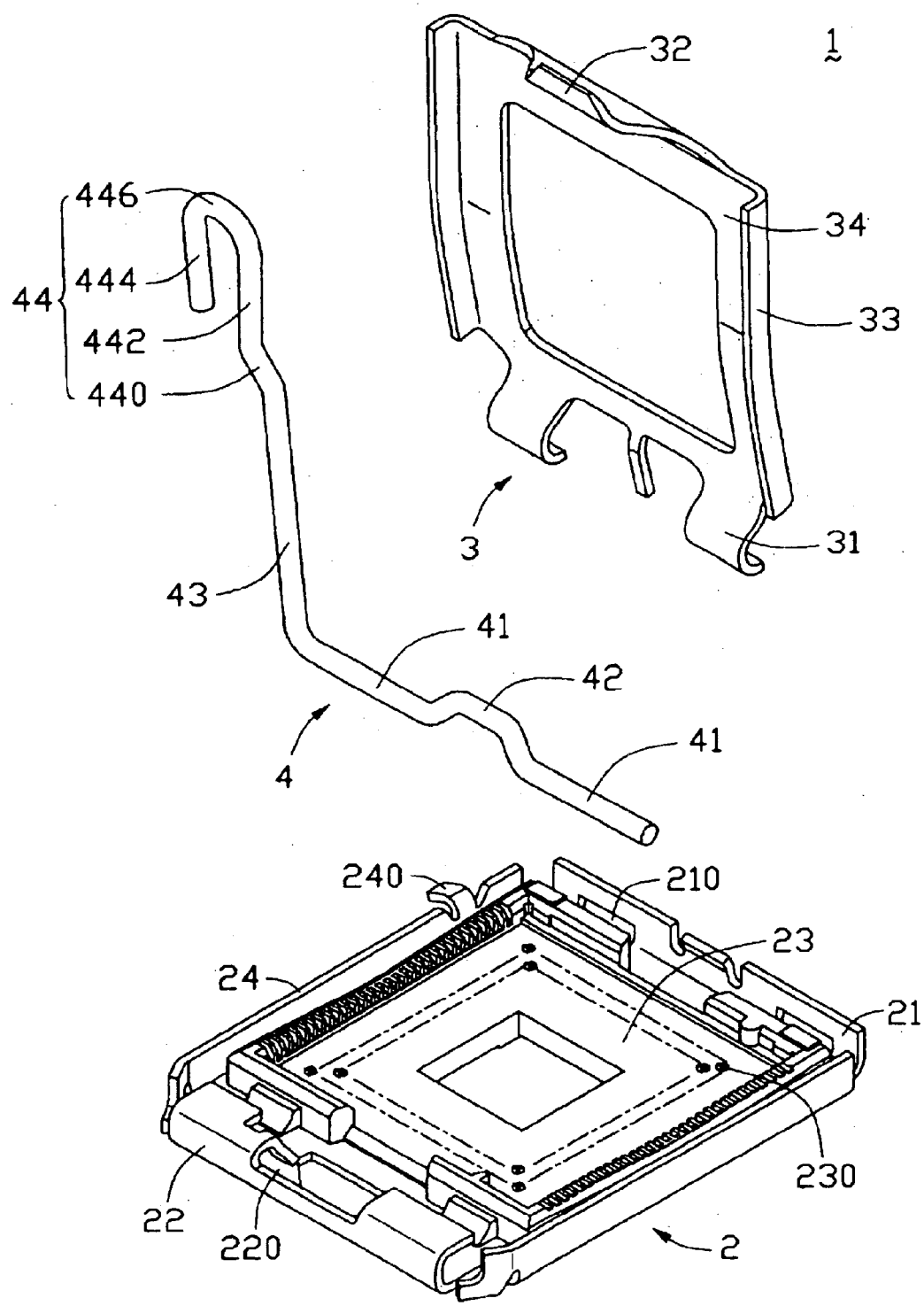
FIG. 1 is a simplified, exploded isometric view of an electrical connector in accordance with the preferred embodiment of the present invention.
Figure 2:
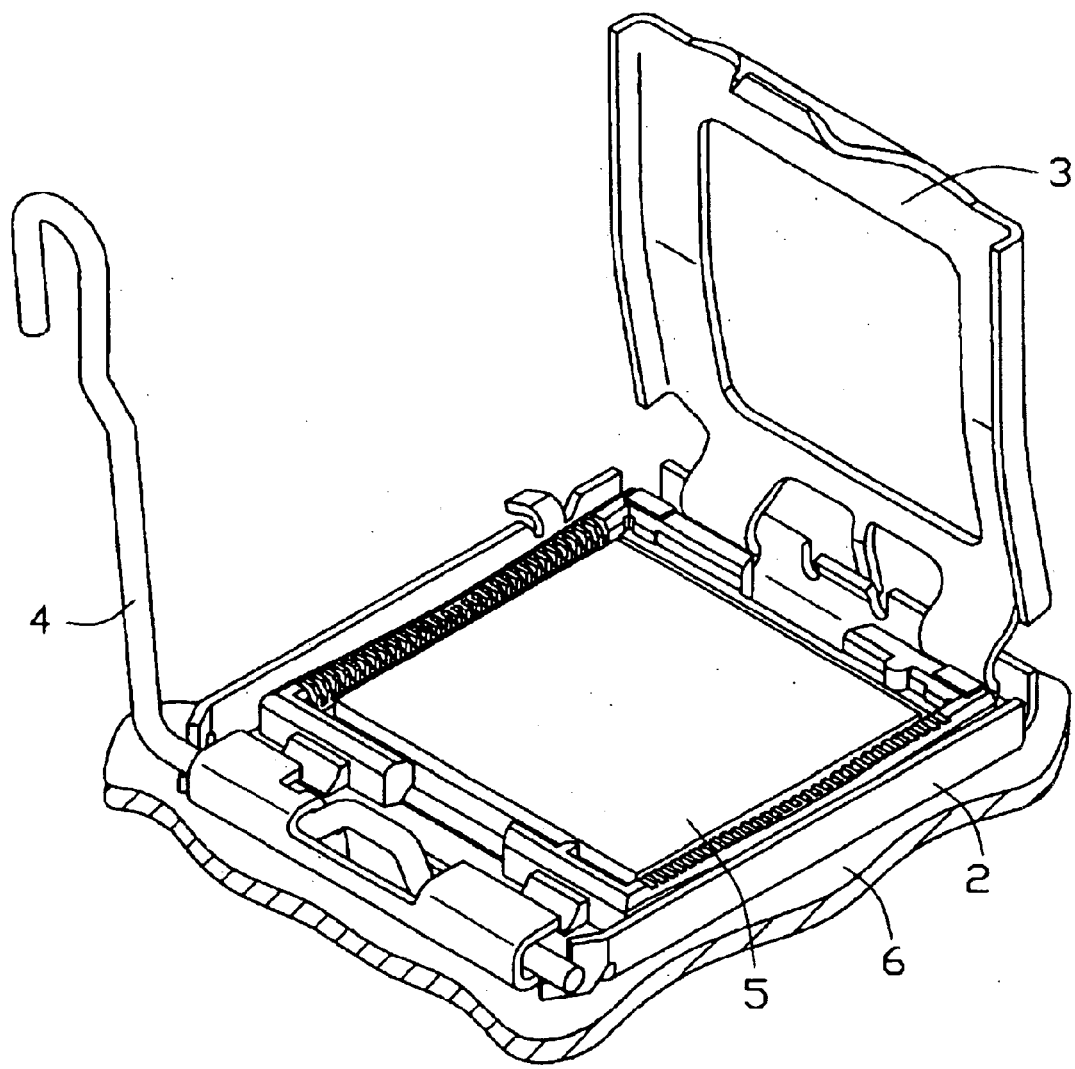
FIG. 2 is an assembled view of FIG. 1; and showing the electrical connector mounted on a PCB, an LGA chip received in the electrical connector, and a cover and a lever of the electrical connector in respective first positions.

Referring to FIGS. 1 and 2, an LGA electrical connector 1 in accordance with the preferred embodiment of the present invention is adapted for electrically connecting an electronic package such as a land grid array (LGA) chip 5 with a circuit substrate such as a printed circuit board (PCB) 6. The LGA connector 1 comprises a connector body 2, a metal clip 3 pivotally mounted to the connector body 2, and a load lever 4 engaged with the connector body 2.

The connector body 2 comprises a main portion 23 defining an opening (not labeled) in a middle thereof, a first end portion 21, a second end portion 22 opposite to the first end portion 21, and a side portion 24 interconnecting the first end portion 21 and the second end portion 22. The main portion 23 defines a plurality of passageways 230 arranged in a rectangular array, for receiving a plurality of conductive terminals (not shown) therein. The first end portion 21 defines a pair of spaced pivot apertures 210. The second end portion 22 defines a receiving groove 220. A curved projection 240 protrudes from the side portion 24 adjacent the first end portion 21, for hooking the load lever 4.

The clip 3 is pivotally mounted to the first end portion 21 of the connector body 2, and comprises a main body 34 defining an opening (not labeled) in a middle thereof. A pair of spaced, curved pivot latches 31 extends from a rear end of the main body 34, the pivot latches 31 engaging in the pivot apertures 210 of the first end portion 21. A hook portion 32 extends from an opposite front end of the main body 34. A pair of side plates 33 depends from opposite sides of the main body 34 respectively, for pressing the LGA chip 5 on the connector body 2.

Figure 3:
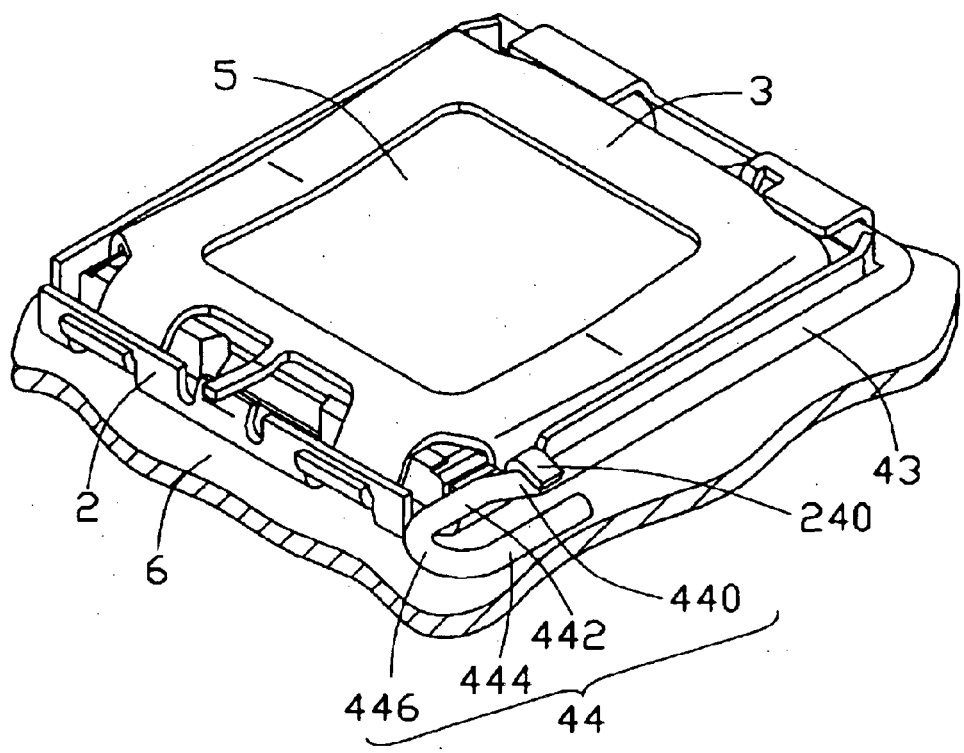
FIG. 3 is similar to FIG. 2, but showing the cover and the lever in respective second positions.
Figure 4:
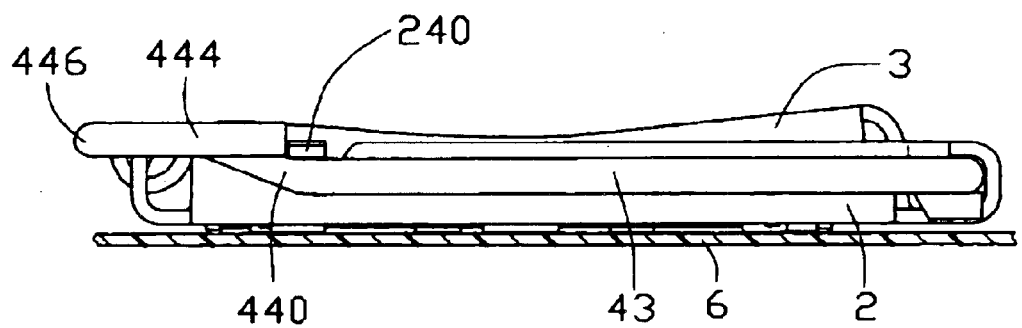
FIG. 4 is a side elevation view of FIG. 3.
Figure 5:
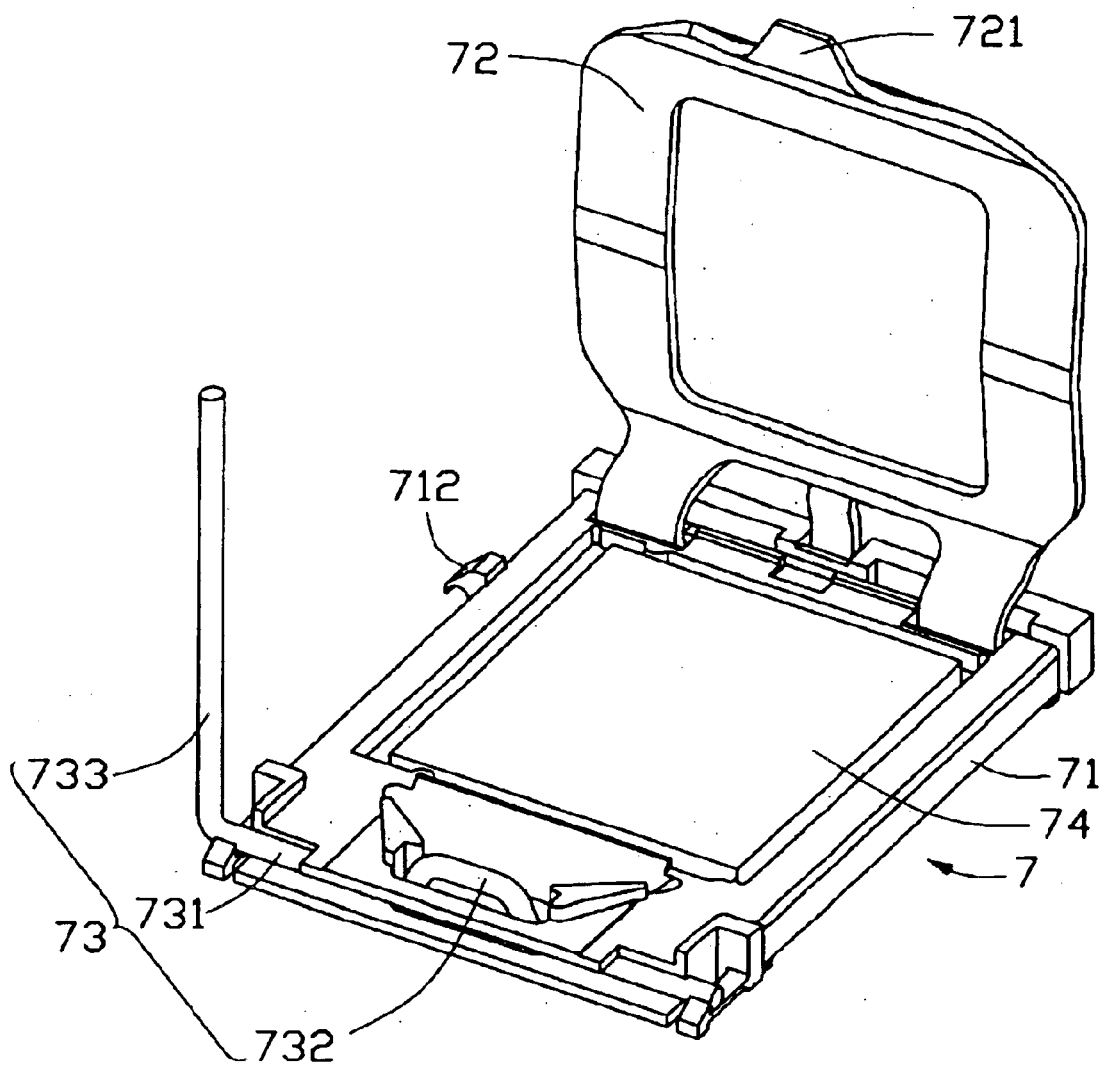
FIG. 5 is an exploded, isometric view of a conventional electrical connector, showing an LGA chip received in the electrical connector.

Referring also FIGS. 3 and 4, the load lever 4 is generally L-shaped, and comprises a pair of pivot axles 41 having an offset pressing portion 42 therebetween, an operational arm 43 extending perpendicularly from an end of one of the pivot axles 41, and an operational portion 44 extending from the operational arm 43. The operational portion 44 comprises an extending portion 440 extending upwardly from and angularly relative to the operational arm 43, a middle portion 442 extending from a distal end of the extending portion 440, a generally U-shaped bending portion 446 extending from a distal end of the middle portion 442, and a handle 444 extending from a distal end of the bending portion 446 and being parallel to the middle portion 442. Thus, when the connector 1 is in a closed state, a distance between the handle 444 and the PCB 6 is greater than a distance between the operational arm 43 and the PCB 6. The pivot axles 41 are pivotably received in receiving groove 220 of the second end portion 22 of the connector body 2. The pressing portion 42 can fix or release the hook portion 32 of the clip 3 by means of an operator (not shown) manually operating the handle 444 of the load lever 4. The clip 3 can thereby fasten the LGA chip 5 on the connector body 2, or release the LGA chip 5 from the connector body 2.

Referring particularly to FIGS. 2 and 3, in use, the LGA connector 1 is firstly arranged to be in an open state. The clip 3 is oriented perpendicular to the connector body 2 in a first position. The lever 4 is oriented in a first position, with the pressing portion 42 thereof at a highest location. The LGA chip 5 is put into the connector body 2 so that it rests on the terminals of the connector body 2. Then, the LGA connector 1 is adjusted to be in a closed state. The clip 3 is rotated down to a horizontal second position, with the side plates 33 abutting against the LGA chip 5. The lever 4 is rotated to a second position, with the pressing portion 42 thereof being engagingly retained in the hook portion 32 of the clip 3, and the operational arm 43 being hooked by the projection 240 of the connector body 2. Thus, the LGA chip 5 is stably and securely fastened in the LGA connector 1. The LGA chip 5 is electrically connected with the terminals of the connector body 2, and is accordingly electrically connected with the PCB 6.

Because the distance between the handle 444 and the PCB 6 is greater than that between the operational arm 43 and the PCB 6, an operation space for operating the handle 444 of the lever 4 is increased. Thus, during operation of the LGA connector 1 from the open state to the closed state, the operator can conveniently operate the handle 444 of the lever 4 without interfering with the PCB 6 or the connector body 2. This configuration helps prevent the operator's hand from being abraded or hurt.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, the electrical connector comprising:
 a connector body fixed on the circuit substrate;
 a clip pivotally mounted to the connector body; and
 a load lever attached to the connector body, the load lever comprising an operational and an operational portion extending from and angularly relative to the operational arm, the operational portion defines a handle in one end thereof,
 wherein when the connector is in a closed state, a distance between the operational portion and the circuit substrate is greater than a distance between the handle and the circuit substrate, a distance between the handle and the side of the connector body which is adjacent to the operational portion is greater than a distance between the operational arm and the same side of the connector body;
 wherein the operational portion comprises an extending portion extending from and angularly relative to the operational arm, a middle portion extending from a distal end of the extending portion, a generally U-shaped bending portion extending from a distal end of the middle portion, the handle extending from a distal end of the bending portion and being parallel to the middle portion.

2. The electrical connector as claimed in claim 1, wherein the load lever comprises a pair of pivot axles having a pressing portion therebetween, one of the pivot axles extending form an opposite end of the operational arm.

3. The electrical connector as claimed in claim 2, wherein the connector body comprises a fist end portion, a second end portion opposite to the first end portion, and a side portion interconnecting the first and second end portions.

4. The electrical connector as claimed in claim 3, wherein the second end portion comprises a receiving groove receiving the pivot axles of the load lever.

5. The electrical connector as claimed in claim 4, wherein the first end portion comprises a pair of spaced pivot apertures, and the side portion comprises a pair of projection for hooking the load lever.

6. The electrical connector as claimed in claim 5, wherein the clip comprises a pair of spaced pivot latches at one end thereof received in the pivot apertures of the connector body, and a hook portion at an opposite end thereof for receiving the pressing portion of the load lever.

* * * * *